March 28, 1950 B. S. VILKOMERSON 2,502,293

TUNING INDICATOR CIRCUIT

Filed April 30, 1948

INVENTOR
BENJAMIN S. VILKOMERSON
BY Philip J. Cooper
ATTORNEY

UNITED STATES PATENT OFFICE 2,502,293

TUNING INDICATOR CIRCUIT

Benjamin S. Vilkomerson, Camden, N. J., assignor to Radio Corporation of America, a corporation of Delaware Application April 30, 1948, Serial No. 24,371

12 Claims. (Cl. 250—40)

This invention relates to a method of and circuit for indicating the proper tuning of a radio receiver and particularly relates to a tuning indicator circuit for visually indicating the extent and sense of mistuning of the receiver.

The importance of the proper tuning of a frequency-modulated carrier-wave receiver (FM receiver) has long been recognized. In order to secure the best signal-to-noise ratio and the least audio distortion the receiver should be tuned in such a manner that the center frequency of the FM wave coincides with the center of the passband of the intermediate-frequency coupling circuits and the discriminator. The frequency departure of an FM broadcast wave from its center frequency amounts to a maximum of 75 kilocycles (kc.) in either direction from the center frequency. On the other hand, the intermediate-frequency passband conventionally has a width of 200 kc. which is more than the width of the FM wave band. Nevertheless, an FM wave should be accurately centered on the intermediate-frequency passband to allow for unavoidable drift of the local oscillator to minimize the effects of non-linearity in the discriminator characteristic. It has also been recognized that it is just as important to provide proper tuning of an amplitude-modulated carrier-wave receiver (AM receiver) in order to prevent distortion of the reproduced signal.

In the past, there have been utilized various circuits for visually indicating the proper tuning of a receiver. Prior tuning indicator circuits conventionally have included an indicator tube of the well known electric shadow type where the proper tuning is indicated by a minimum angle or width of the shadow on the indicator target. However, in most prior tuning indicator circuits for FM receivers the shadow angle is not only a minimum when the receiver is properly tuned but also in the absence of a carrier wave or when the wave is far off tune. A tuning indicator circuit which will overcome this disadvantage of prior tuning indicator circuits has been disclosed and claimed in the patents to Herold 2,286,412 and 2,286,413, granted on June 16, 1942. The tuning indicator circuits disclosed in the Herold patents are designed to combine an automatic volume control voltage (A. V. C. voltage) with two mean voltages derived from the output of the frequency discriminator of the receiver. However, the tuning indicator circuits disclosed by Herold do not provide a visual indication of the sense of mistuning of the receiver. Furthermore, proper tuning is indicated on the target of the indicator tube by a minimum shadow angle which does not permit as sharp an indication as desired in some cases.

It is the principal object of the present invention to provide a novel method of and circuit for indicating the proper tuning of a radio receiver.

Another object of the invention is to provide a tuning indicator circuit for indicating visually not only the presence or absence of the carrier wave and the amount of mistuning of the receiver but also whether the receiver is mistuned above or below the center or carrier frequency of the modulated wave to be received.

A further object of the invention is to provide a tuning indicator circuit including an electronic shadow indicator tube which will show visually on its target by the width of a shadow or by the width of an overlapping bright portion, the sense and amount of mistuning of the receiver and which will remain dark in the absence of a carrier wave.

The tuning indicator circuit of the present invention may be embodied in an AM or FM receiver. In either case, there must be provided a balanced frequency discriminator. A balanced frequency discriminator will inherently develop in its output circuit a rectified signal whose mean voltage is proportional in polarity and magnitude to the sense and amount of frequency departure of the center frequency of a modulated carrier wave to be received from the assigned center frequency value of the discriminator. An integrating circuit coupled to the output circuit of the balanced frequency discriminator will derive a mean or direct current voltage component from the rectified signal which is either positive, if the receiver is mistuned in one direction, or negative, if the receiver is mistuned in the other direction, and which will be zero when the receiver is properly tuned. The magnitude and polarity of this mean voltage is indicated in accordance with the invention by an electronic indicator device such as an electronic shadow indicator tube.

Since exact tuning of a carrier wave or absence of a carrier wave both give a zero direct current voltage from the discriminator, there is derived a control voltage such as an A. V. C. voltage which is indicative of the presence or absence of the carrier wave to be received. Thus, the A. V. C. voltage will be zero in the absenec of the wave and will have a predetermined minimum magnitude when a carrier wave is received. The A. V. C. voltage may be derived in a conventional manner or alternatively, from a ratio detector. In accordance with the present invention, the A. V. C. voltage is utilized for indicating the presence or absence of the wave to be received. Preferably, this is effected by normally rendering the target of the indicator tube dark unless a wave is received in which case the developed A. V. C. voltage permits the target to become illuminated. The sense of mistuning of the receiver is indicated in accordance with the invention by the appearance on the target either of a shadow or of an overlapping bright portion. The receiver is properly tuned when the indicator target is uniformly illuminated.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5:
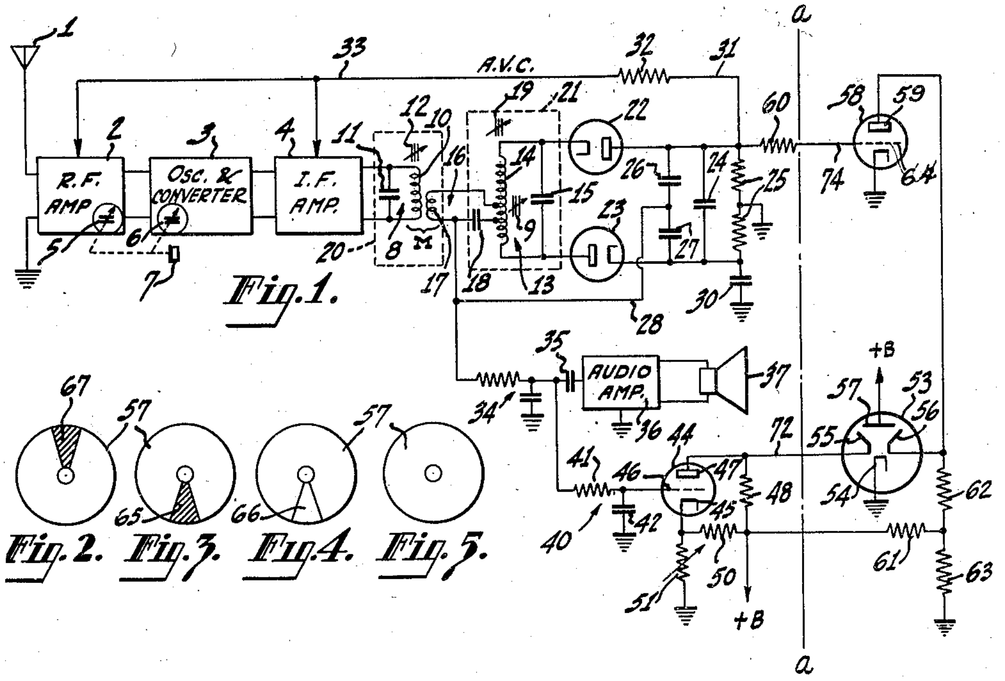
Fig. 1 is a circuit diagram, partly in block form, of a radio receiver including the tuning indicator circuit of the invention.
Figs. 2 to 5 are plan views of the target of the electronic shadow indicator tube of the circuit of Fig. 1 illustrating the appearance of the target when the receiver is mistuned or properly tuned (Fig. 5)

Referring now particularly to Fig. 1 of the drawing, there is illustrated a radio receiver provided with the tuning indicator circuit of the present invention. A modulated carrier wave such as an FM wave may be intercepted by antenna 1 and amplified by radio-frequency amplifier stage 2. The radio-frequency wave derived from amplifier 2 is converted by frequency converter 3 to an intermediate-frequency wave which is further amplified by one or more intermediate-frequency amplifiers 4. Radio-frequency amplifier 2 and the local oscillator of frequency converter 3 are tunable to the desired frequency by variable reactances such as capacitors 5 and 6. Capacitors 5 and 6 are variable in unison by tuning control knob 7 in accordance with conventional practice.

The last intermediate-frequency amplifier 4 has an output circuit 8 comprising coil 10 tuned by capacitor 11. The inductance of coil 10 may be adjusted by paramagnetic core 12. Intermediate-frequency output circuit 8 forms the primary circuit of the frequency discriminator network which includes secondary circuit 13 comprising coil 14 tuned by capacitor 15. Primary circuit 8 and secondary circuit 13 are coupled to each other by link circuit 16 comprising coil 17 and capacitor 18 arranged in series. Coils 10 and 17 are magnetically coupled as indicated. One terminal of coil 17 is connected near the midpoint of coil 14. The other terminal of coil 17 is coupled through capacitor 18 to another tap on coil 14 which is closely adjacent but on the other side of the midpoint of coil 14. Primary circuit 8 is magnetically shielded by shield 20 indicated in dotted lines and secondary circuit 13 is also magnetically shielded by shield or can 21. Thus, coils 10 and 14 are not magnetically coupled but are coupled through link circuit 16. By means of paramagnetic core 9, coil 14 may be properly balanced. Paramagnetic core 19 serves the purpose of adjusting the resonant frequency of secondary circuit 13. The balance of coil 14 may have to be readjusted by core 9 after the coil is tuned by core 19.

The frequency discriminator network including primary circuit 8 and secondary circuit 13 forms part of a balanced frequency discriminator. Preferably, the frequency discriminator is of the ratio detector type which has been described by Stuart Wm. Seeley on page 26 of the December 1947 issue of "FM and Television." The ratio detector illustrated in Fig. 1 comprises two rectifiers such as vacuum diodes 22 and 23. The cathode of diode 22 is connected to one terminal of secondary circuit 13 while its other terminal is connected to the anode of diode 23. Stabilizing capacitor 24 is connected to the anode of diode 22 and to the cathode of diode 23. Stabilizing capacitor 24 is shunted by resistor 25 having its midpoint grounded as shown. Stabilizing capacitor 24 presents a low impedance to intermediate-frequency and modulation-frequency currents. Stabilizing capacitor 24 and resistor 25 are chosen in such a manner that they have a time constant of the order of 0.1 second which is larger than a cycle of the modulation frequency. Load capacitors 26 and 27 are arranged in series and by-pass stabilizing capacitor 24. Low capacitors 26 and 27 have a low impedance to intermediate-frequency currents but a high impedance to modulation-frequency currents. The junction point of load capacitors 26, 27 is connected through lead 28 to the junction point between coil 17 and capacitor 18 of link circuit 16.

The ratio detector of Fig. 1 operates in a conventional manner. The frequency discriminator network is balanced at the center frequency, that is, at the center frequency the voltages impressed upon diodes 22 and 23 are of equal magnitude. Accordingly, the voltage at the junction point of load capacitors 26, 27 will be equal to that of the midpoint of resistor 25 which is at ground potential. However, when the frequency of the FM wave deviates from its center frequency, the frequency discriminator network becomes unbalanced and the voltage impressed upon diode 22 will be unequal to that impressed upon diode 23. Accordingly, the voltage of the junction point of load capacitors 26 and 27 will no longer be zero.

It may be assumed that the voltage of the junction point of load capacitors 26, 27 will become positive when the frequency of the FM wave is higher than its center frequency, and inversely, that this voltage will become negative when the instantaneous frequency of the FM wave becomes lower than its center frequency.

The ratio detector may be provided with a small capacitor 30 arranged between the cathode or diode 23 and ground for by-passing high harmonics of the intermediate frequency to ground. Since stabilizing condenser 24 is of low impedance to these currents, the anode of diode 22 will also be maintained at a high frequency ground potential.

When a modulated carrier wave is received, a voltage is developed across stabilizing condenser 24 and resistor 25 which varies slowly with changes in amplitude of the received wave. Thus, an A. V. C. voltage may be derived from lead 31 connected to the junction point between resistor 25 and the anode of diode 22. The A. V. C. voltage may be impressed in a conventional manner through filter resistor 32 upon intermediate-frequency amplifier 4 and radio-frequency amplifier 2 as indicated by lead 33.

The rectified or demodulated signal may be obtained from lead 28 and fed through de-emphasis network 34 and coupling condenser 35 to audio amplifier 36. The amplified audio signal may be reproduced by loud speaker 37. De-emphasis network 34 comprises a series condenser and shunt resistor. It is conventional practice to provide a pre-emphasis network in one of the audio amplifiers of an FM transmitter which attenuates frequencies below 1500 cycles more than higher frequencies. De-emphasis network 34 is conventionally provided in an FM receiver for the purpose of reducing frequencies above 1500 cycles more than the lower frequencies to establish again the proper balance of the audio signal.

In accordance with the present invention the output signal derived from the ratio detector is utilized for obtaining a tuning indication of the amount and sense of mistuning of the receiver. To this end the output signal of the ratio detector is filtered by low-pass or audio filter network 40 comprising series resistor 41 connected to the junction point between de-emphasis network 34 and coupling condenser 35 and shunt capacitor 42. The signal derived from filter network 40 is the mean voltage or direct current voltage component of the rectified signal, that is, the audio signal. As explained hereinbefore this mean voltage will only be zero when the receiver is properly tuned, and will be either positive or negative when the receiver is tuned to a frequency above the assigned center frequency of secondary circuit 13 or below this assigned frequency, respectively.

This mean voltage is now impressed on direct current amplifier 44 including cathode 45, control grid 46 and anode 47. Control grid 46 is connected to filter network 40. Anode 47 is connected to a suitable positive voltage supply indicated at +B through anode resistor 48. Cathode 45 is also connected to +B through resistor 50 and is connected to ground through cathode resistor 51 which may be adjustable as shown. Resistors 50 and 51 accordingly function as a voltage divider which will keep cathode 45 at a predetermined positive voltage.

The output signal developed across anode resistor 48 is impressed on one of the control rods or vanes of a double vane indicator tube 53 of the electric shadow type which may be a 6AF6 tube. Indicator 53 has a grounded cathode 54, two control rods 55, 56 and a fluorescent target 57 connected to +B as shown. Control rod 55 is connected to the anode 47 of amplifier 44.

Control rod 56 of indicator tube 53 is connected to the output of amplifier 58. Amplifier 58 preferably has a high amplification factor for a purpose to be explained hereinafter. The cathode of amplifier 58 is grounded while its control grid 64 is connected through resistor 60 to lead 31 which carries the A. V. C. voltage. The anode 59 of amplifier 58 is tied to control rod 56 of indicator tube 53. Voltage supply +B is connected to both control rod 56 and the anode 59 of amplifier 58 through series resistors 61, 62 having their junction point connected to ground through resistor 63.

The tuning indicator circuit of the present invention operates as follows: Let it be assumed that tuning control knob 7 is so adjusted that the receiver is mistuned and the center frequency of the received FM wave is higher than the assigned center frequency value of secondary circuit 13. In that case, the demodulated signal has a positive mean voltage and this positive voltage will be impressed upon control grid 46 of amplifier 44. Accordingly, amplifier 44 will conduct more space current with a correspondingly larger voltage drop across anode resistor 48. The voltage of control rod 55 will therefore decrease. When the voltage of control rod 55 decreases, it will repel electrons and project a shadow on target 57. The angle of the shadow 65 appearing on target 57 which is controlled by rod 55, will increase as illustrated in Fig. 3.

Let it now be assumed that tuning control knob 7 is so adjusted that the receiver is mistuned and the center frequency of the FM wave is below the assigned center frequency value of secondary circuit 13. In that case, the mean voltage of the audio signal is negative and this negative voltage will be impressed upon control grid 46 of amplifier 44. In view of the reduced space current through amplifier 44 the voltage impressed upon control rod 55 will rise. Control rod 55 will therefore attract electrons and an overlapping bright portion 66 will appear on target 57 as shown in Fig. 4. Overlapping portion 66 will be brighter than the remainder of the target.

If tuning control knob 7 is adjusted so that the receiver is correctly tuned, the mean voltage of the audio signal is zero. Accordingly, a voltage of zero magnitude is impressed upon control grid 46 of amplifier 44. Cathode resistor 51 is adjusted in such a manner that cathode 45 has a predetermined positive voltage. Under these conditions the space current of amplifier tube 44 is of such a magnitude that the voltage of control rod 55 is just sufficient to cause either shadow 65 or overlapping bright portion 66 just to disappear. Target 57 accordingly will be uniformly illuminated as shown in Fig. 5.

However, target 57 will also be uniformly illuminated as shown in Fig. 5 in the absence of a carrier wave or when the receiver is too far off tune. Such a condition would be quite confusing to the set operator. Accordingly, a second indication is obtained on indicator target 57 which indicates the presence or absence of a carrier wave.

Let it be assumed that no carrier wave is received or that the receiver is so badly mistuned that the amplitude of the carrier wave is below a certain minimum level. In that case, no A. V. C. voltage will be developed and the control grid 64 of amplifier 58 will be at ground potential because it is connected to ground through resistor 60 and a portion of resistor 25. Since the cathode of amplifier 58 is also grounded, the amplifier will be normally conducting. The space current of amplifier 58 flowing through resistors 61 and 62 will reduce the voltage impressed on control rod 56. Accordingly, control rod 56 will prevent electrons from reaching target 57 and a shadow 67 will appear on target 57 as shown in Fig. 2. Shadow 67 appears opposite shadow 65 which is controlled by control rod 55. When target 57 has the appearance illustrated in Fig. 2, this will indicate to the set operator that no wave is being received.

As soon as a carrier wave is received, an A. V. C. voltage of negative polarity is developed and impressed on the control grid 64 of amplifier 58 which will immediately cut off the amplifier in view of its high amplification factor. The voltage impressed on control rod 56 is now determined by that of the positive voltage of the junction point between resistors 61 and 63. Accordingly, shadow 67 will disappear as shown in Figs. 3 to 5 inclusive.

Figure 6:
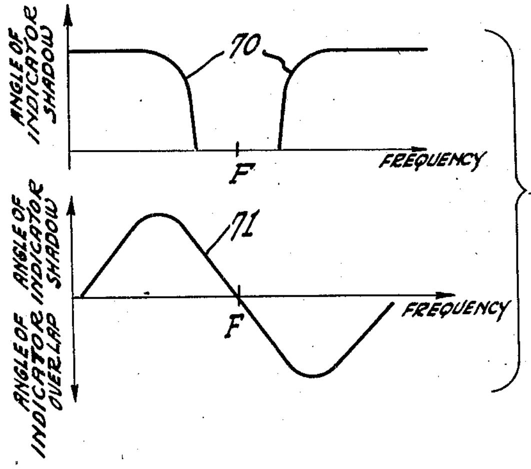
Fig. 6 is a graph illustrating the angle of the shadow or the angle of the overlapping bright portion of the target of the indicator tube of Fig. 1 with variations of the resonant frequency of the receiver.

Referring now to Fig. 6 there is illustrated the angle of the indicator shadows or of the bright portion appearing on target 57. Curve 70 indicates the angle of shadow 67, that is, the shadow controlled by rod 56 in accordance with the A. V. C. voltage with variations of the resonant frequency of the receiver. As soon as tuning control knob 7 is adjusted so that the frequency of the received FM wave approaches the center frequency value of secondary circuit 13 from either direction, shadow 67 will disappear. Curve 71 indicates the angle of the indicator shadow or the overlapping bright portion controlled by rod 55 in accordance with the mean voltage of the demodulated signal. The angle of the shadow or of the bright portion is plotted against variations of the frequency to which the receiver is tuned. It will be seen from curve 71 that the correct tuning position shown at F can be determined very accurately because both shadow 65 or the overlapping bright portion 66 will disappear when the receiver is correctly tuned. The tuning indicator circuit of the present invention thus permits a visual indication of both the amount and sense of mistuning of the receiver.

It will be understood that the ratio detector which has been illustrated by way of example in Fig. 1 may be replaced by any conventional balanced frequency discriminator. Furthermore, the A. V. C. voltage may also be derived in any other conventional manner. Thus, most balanced frequency discriminators require a limiter stage which usually has grid limiting action. In that case, an A. V. C. voltage may be derived from the grid circuit of the limiter. The circuit of Fig. 1, however, has the advantage that both control voltages required for the tuning indicator circuit are derived from the ratio detector. It is also to be understood that the tuning indicator circuit of the present invention may be incorporated in a conventional AM receiver. In that case, the demodulated signal is derived from a conventional detector. When the intermediate-frequency wave is impressed on a ratio detector or other balanced frequency discriminator, the tuning indicator circuit of the invention will operate in the manner described in connection with Fig. 1 to indicate the deviation of the carrier frequency from the frequency of the discriminator.

Figure 7:
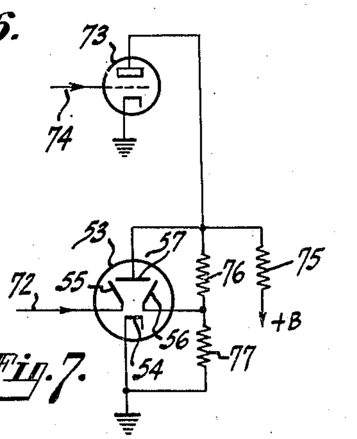
Fig. 7 is a circuit diagram of a preferred tuning indicator circuit in accordance with the present invention.

Referring now to Fig. 7 there is illustrated a preferred modification of the tuning indicator circuit of the present invention. The circuit of Fig. 7 replaces that portion of the circuit of Fig. 1 arranged to the right of dotted line *a*—*a*. The tuning indicator circuit of Fig. 7 comprises a double vane indicator tube 53 having its control rod 55 connected by lead 72 to the anode 47 of amplifier 44. Amplifier 73 preferably has a lower amplification factor but larger space current than amplifier 58 and has its control grid connected through lead 74 to resistor 60. Target 57 of indicator tube 53 and the anode of amplifier 73 are connected together to +B through anode resistor 75. The junction point between anode resistor 75 and target 57 is connected to control rod 56 through resistor 76, and control rod 56 is connected to ground through resistor 77. Resistors 76 and 77 accordingly form a voltage divider. Cathode 54 of indicator tube 53 is grounded.

The circuit of Fig. 7 operates as follows. The action of control rod 55 is the same as previously described and illustrated in Figs. 3 to 5. When no carrier wave is received, no A. V. C. voltage is developed and impressed on the control grid of amplifier 73. The amplifier is accordingly normally conducting. The space current of amplifier 73 flowing through anode resistor 75 will reduce the voltage of target 57 to such a low value that target 57 will remain dark. Accordingly, shadow 67 will be invisible because the entire target 57 is dark.

As soon as a carrier wave of sufficient strength is received, an A. V. C. voltage will be developed which will cut off the space current of amplifier 73. Target 57 accordingly has substantially the voltage of voltage source +B and the electrons will reach the target to illuminate it in the manner previously described. The voltage of control rod 56 is fixed at such a value by voltage divider 76, 77 that no shadow is developed on target 57. Accordingly, control rod 56 of indicator tube 53 may be omitted in the circuit of Fig. 7.

Since amplifier 73 has a low amplification factor, the brightness of target 57 depends to a certain extent on the strength of the received carrier wave. In other words, unless the A. V. C. voltage exceeds a certain value, amplifier 73 will still conduct space current to a certain extent. The brightness of target 57 thus indicates the strength of a wave of marginal strength which is received. The circuit of Fig. 7 has the advantage that the target will remain dark unless a carrier wave is being received.

It will be understood that the circuit specifications of the tuning circuit of the invention may vary according to the design for any particular application. The following circuit specifications for the circuits of Figs. 1 and 7 are included by way of example only:

Amplifier 44—½ type 6SL7
Amplifier 58—½ type 6SL7
Indicator tube 53—type 6AF6
Voltage supply +B—+250 volts
Resistor 41—1,000,000 ohms
Adjustable resistor 51—0 to 5,000 ohms
Resistor 50—100,000 ohms
Resistor 48—1,000,000 ohms
Resistor 61—1,000,000 ohms
Resistor 63—2,200,000 ohms
Resistor 62—500,000 ohms
Resistor 25—20,000 ohms
Resistor 60—220,000 ohms
Capacitor 42—.1 microfarad
Stabilizing capacitor 24—5 microfarad
Load capacitor 26—.005 microfarad
Load capacitor 27—.005 microfarad
Capacitor 30—100 micromicrofarad
Amplifier 73—type 6C4
Resistor 75—47,000 ohms
Resistor 76—560,000 ohms
Resistor 77—390,000 ohms There has thus been described a tuning indicator circuit for an FM or AM receiver which will indicate visually by means of an electronic indicator tube the presence or absence of a carrier wave and the amount of mistuning of the receiver. Furthermore, the electronic indicator tube will indicate by the appearance of either a shadow portion or of an overlapping bright portion on its target whether the receiver is mistuned above or below the center or carrier frequency of the wave to be received. In accordance with a preferred embodiment of the tuning indicator circuit of the invention illustrated in Fig. 7, the target of the tuning indicator tube will remain dark unless a carrier wave is received. This greatly facilitates the proper tuning of the receiver and reduces the possibility of confusion of the set operator to a minimum. The tuning indicator circuit of Fig. 7 will also indicate to a certain extent by the brightness of the indicator target the amplitude or strength of the received wave. Thus, a station of marginal utility is indicated by the dim illumination of the indicator target.

What is claimed is:

1. In a radio receiver for receiving a modulated carrier wave, a balanced frequency discriminator having an output circuit for developing a rectified signal whose mean voltage is proportional in polarity and magnitude to the sense and amount of frequency departure of the center frequency of said wave from the assigned center frequency value of said discriminator, a filter circuit coupled to said output circuit for deriving said mean voltage from said signal, an electronic indicator device coupled to said filter circuit for indicating the magnitude and polarity of said mean voltage, said receiver including circuit means coupled to said discriminator for deriving a control voltage representative of the presence or absence of said carrier wave, and further indicator means coupled to said circuit means for indicating the presence of said control voltage, thereby to indicate the presence or absence of said wave and the amount and sense mistuning of said receiver.

2. In a radio receiver for receiving a modulated carrier wave, a balanced frequency discriminator having an output circuit for developing a rectified signal whose mean voltage is proportional in polarity and magnitude to the sense and amount of frequency departure of the center frequency of said wave from the assigned center frequency value of said discriminator, a filter circuit coupled to said output circuit for deriving said mean voltage from said signal, said receiver including circuit means coupled to said discriminator for deriving a control voltage which is zero in the absence of a carrier wave and which has a predetermined magnitude when a carrier wave is received, and an electronic indicator device coupled to said filter circuit and to said circuit means for separately and visually indicating the magnitude and polarity of said mean voltage and the presence or absence of said control voltage.

3. In a radio receiver for receiving a modulated carrier wave, a balanced frequency discriminator having an output circuit for developing a rectified signal whose mean voltage is proportional in polarity and magnitude to the sense and amount of frequency departure of the center frequency of said wave from the assigned center frequency value of said discriminator, a filter circuit coupled to said output circuit for deriving said mean voltage from said signal, said receiver including circuit means for deriving a control voltage which is zero in the absence of a carrier wave and which has a predetermined minimum magnitude when a carrier wave is received, an electronic indicator device for indicating the magnitude and polarity of said mean voltage, said device being arranged to be normally inoperative, and a circuit connection between said circuit means and said device to impress said control voltage on said device and to render said device operative for indicating the presence of said control voltage, thereby to indicate the presence or absence of said wave and the sense and amount of mistuning of said receiver.

4. In a radio receiver for receiving a modulated carrier wave, a balanced frequency discriminator having an output circuit for developing an output signal having a mean voltage proportional in magnitude and polarity to the amount and sense of frequency deviation of the center frequency of said wave from the assigned center frequency of said discriminator, a filter circuit coupled to said output circuit for deriving said mean voltage from said signal, said receiver including circuit means for developing a control voltage representative of the presence or absence of said wave, an electronic shadow indicator tube having a target and two control elements, said control elements controlling the width of two distinct shadow portions or bright portions on said target, and circuit connections for impressing said mean voltage on one of said control elements and said control voltage on the other one of said control elements, thereby to indicate on said target the presence or absence of said wave and the amount and sense of mistuning of said receiver.

5. In a radio receiver for receiving a modulated carrier wave, a balanced frequency discriminator having an output circuit for developing an output signal having a mean voltage proportional in magnitude and polarity to the amount and sense of frequency deviation of the center frequency of said wave from the assigned center frequency of said discriminator, a filter circuit coupled to said output circuit for deriving said mean voltage from said signal, said receiver including circuit means for developing a control voltage of zero magnitude in the absence of said wave, and of a predetermined magnitude in the presence of said wave, an electronic shadow indicator tube having a target and two control elements, said control elements controlling individually the width of two distinct shadow portions or bright portions on said target, a circuit connection for impressing said mean voltage on one of said control elements, and a further circuit connection for impressing said control voltage on the other one of said control elements and on said target, thereby to indicate on said target the presence or absence of said wave and the amount and sense of mistuning of said receiver.

6. In a radio receiver for receiving a modulated carrier wave, a ratio detector having a frequency discriminator network, two rectifiers coupled to said network, a condenser of low impedance to modulation frequency currents connected across said rectifiers, a resistor connected across said condenser, said rectifiers being connected to provide a direct current path through said rectifiers and said resistor, a load impedance element connected to one of said rectifiers for developing thereacross an output signal having a mean voltage of a magnitude and polarity dependent upon the amount and sense of frequency deviation of the center frequency of said wave from the assigned center frequency of said frequency discriminator network, a filter circuit coupled to said load impedance element for deriving said mean voltage from said signal, said receiver including circuit means for developing a control voltage having zero magnitude in the absence of a wave and a predetermined minimum magnitude when a wave is received, and an electronic indicator device coupled to said filter circuit and to said control voltage developing means for separately and visually indicating said mean voltage and said control voltage.

7. In a radio receiver for receiving a modulated carrier wave, a ratio detector having a frequency discriminator network, two rectifiers coupled to said network, a condenser of low impedance to modulation frequency currents connected across said rectifiers, a resistor connected across said condenser, said rectifiers being connected to provide a direct current path through said rectifiers and said resistor, a load impedance element connected to one of said rectifiers for developing thereacross an output signal having a mean voltage of a magnitude and polarity dependent upon the amount and sense of frequency departure of the center frequency of said wave from the assigned center frequency of said frequency discriminator network, a filter circuit coupled to said load impedance element for deriving said mean voltage from said signal, a circuit connected across at least a portion of said resistor for developing a control voltage having zero magnitude in the absence of a wave and a predetermined minimum magnitude when a wave is received, and an electronic indicator device coupled to said filter circuit and to said control voltage developing circuit for separately and visually indicating said mean voltage and said control voltage.

8. In a radio receiver for receiving a modulated carrier wave, a ratio detector having a frequency discriminator network, two rectifiers coupled to said network, a condenser of low impedance to modulation frequency currents connected across said rectifiers, a resistor connected across said condenser, said rectifiers being connected to provide a direct current path through said rectifiers and said resistor, said condenser and said resistor being chosen to have a time constant which is larger than a cycle of the modulation frequency, a load impedance element connected to one of said rectifiers for developing thereacross an output signal having a direct current voltage component of a magnitude and polarity dependent upon the amount and sense of frequency deviation of the center frequency of said wave from the assigned center frequency of said frequency discriminator network, a filter circuit coupled to said load impedance element for deriving said voltage component from said signal, a circuit connected across at least a portion of said resistor for developing an automatic gain control voltage having zero magnitude in the absence of a wave and a predetermined minimum magnitude when a wave is received, and an electronic shadow indicator tube coupled to said filter circuit and to said automatic gain control voltage developing circuit for visually indicating both the magnitude and polarity of said voltage component and the presence or absence of said control voltage.

9. In a radio receiver for receiving a modulated carrier wave, a ratio detector comprising a frequency discriminator network, two rectifiers coupled to said network, a condenser of low impedance to modulation frequency currents connected across said rectifiers, a resistor shunting said condenser, a load impedance element connected to one of said rectifiers for developing an output signal, said condenser and said resistor being chosen to have a time constant which is larger than a cycle of the modulation frequency, said signal having a direct current voltage component of a magnitude and polarity determined by the amount and sense of frequency departure of the center frequency of said wave from the assigned center frequency of said frequency discriminator network, a filter circuit coupled to said load impedance element for deriving said voltage component from said signal, a first amplifier coupled to said filter circuit and arranged to have its space current controlled in accordance with the polarity and magnitude of said voltage component, said receiver including circuit means for developing an automatic gain control voltage, a second amplifier coupled to said circuit means and arranged to be normally conducting in the absence of the carrier wave and to be cut off by said control voltage, an electronic shadow indicator tube having a target and two control elements for controlling independently two shadow or bright portions on said target, the output of said first amplifier being connected to one of said control elements, the output of said second amplifier being connected to the other one of said control elements, whereby the absence or presence of one of the shadows on said target indicates the presence or absence of said wave and the width of the other one of the shadows or the width of the bright portion on said target indicate the amount and sense of mistuning of said receiver.

10. In a radio receiver for receiving a modulated carrier wave, a ratio detector comprising a frequency discriminator network, two rectifiers coupled to said network, a condenser of low impedance to modulation frequency currents connected across said rectifiers, a resistor shunting said condenser, at least one load impedance element coupled to said rectifiers for developing a rectified signal, said condenser and said resistor being chosen to have a time constant which is larger than a cycle of the modulation frequency, said signal having a direct current voltage component of a magnitude and polarity determined by the amount and sense of frequency deviation of the center frequency of said wave from the assigned center frequency of said frequency discriminator network, a filter circuit coupled to said load impedance element for deriving said voltage component from said signal, a first amplifier coupled to said filter and arranged to have its space current controlled in accordance with the polarity and magnitude of said voltage component, a circuit connected across at least a portion of said resistor for developing a control voltage having zero magnitude in the absence of said carrier wave, a second amplifier coupled to said circuit and arranged to be normally conducting in the absence of the carrier wave and to be cut off by said control voltage, an electronic shadow indicator tube having a target and two control elements for controlling individually two shadow or bright portions on said target, the output of said first amplifier being connected to one of said control elements, the output of said second amplifier being connected to the other one of said control elements, whereby the absence or presence of one of the shadows on said target indicates the presence or absence of said wave and the width of the other one of the shadows or the width of the bright portion on said target indicate the amount and sense of mistuning of said receiver.

11. In a radio receiver for receiving a modulated carrier wave, a ratio detector comprising a frequency discriminator network, two rectifiers coupled to said network, a condenser of low impedance to modulation frequency currents connected across said rectifiers, a resistor shunting said condenser, a load impedance element connected to one of said rectifiers for developing an output signal, said condenser and said resistor being chosen to have a time constant which is larger than a cycle of the modulation frequency, said signal having a direct current voltage component of a magnitude and polarity determined by the amount and sense of frequency deviation of the center frequency of said wave from the assigned center frequency of said frequency discriminator network, a filter circuit coupled to said load impedance element for deriving said voltage component from said signal, a first amplifier coupled to said filter circuit and arranged to have its space current controlled in accordance with the polarity and magnitude of said voltage component, a circuit connected across at least a portion of said resistor for developing a given control voltage having zero magnitude in the absence of said carrier wave, a second amplifier coupled to said circuit and arranged to be normally conducting in the absence of the carrier wave and to be cut off by said control voltage, an electronic shadow indicator tube having a target and two control elements for controlling independently two shadow or bright portions on said target, the output of said first amplifier being connected to one of said control elements, said first amplifier being adjusted to develop an output such as to produce neither a shadow nor a bright portion on said target when said voltage component has zero magnitude, the output of said second amplifier being connected to the other one of said control elements, whereby the absence or presence of one of the shadows on said target indicates the presence or absence of said wave and the width of the other one of the shadows or of its bright portion on said target indicate the amount and sense of mistuning of said receiver.

12. In a radio receiver for receiving a modulated carrier wave, a ratio detector comprising a frequency discriminator network, two rectifiers coupled to said network, a condenser of low impedance to modulation frequency currents connected across said rectifiers, a resistor shunting said condenser, a load impedance element connected to one of said rectifiers for developing a rectified signal, said condenser and said resistor being chosen to have a time constant which is larger than a cycle of the modulation frequency, said signal having a direct current voltage component of a magnitude and polarity determined by the amount and sense of frequency departure of the center frequency of said wave from the assigned center frequency of said frequency discriminator network, a filter circuit coupled to said load impedance element for deriving said voltage component from said signal, a first amplifier coupled to said filter circuit and arranged to have its space current controlled in accordance with the polarity and magnitude of said voltage component, a circuit connected across at least a portion of said resistor for developing an automatic gain control voltage having zero magnitude in the absence of said wave, a second amplifier coupled to said circuit and arranged to be normally conducting in the absence of the carrier wave and to be cut off by said control voltage, an electronic shadow indicator tube having a target and at least one control element for controlling a shadow or bright portion on said target, the output of said first amplifier being connected to one of said control elements, said first amplifier being adjusted to develop an output such as to produce neither a shadow nor a bright portion on said target when said voltage component has zero magnitude, the output of said second amplifier being connected to said target to render said indicator tube dark and inoperative in the absence of a wave and to make said shadow or bright portion visible only when said control voltage cuts off said second amplifier, whereby the width of the shadow or the width of the bright portion on said target indicates the amount and sense of mistuning of said receiver.

BENJAMIN S. VILKOMERSON.

REFERENCES CITED

The following references are of record in the file of this patent:

UNITED STATES PATENTS

| Number | Name | Date |
|---|---|---|
| 2,189,300 | Roberts | Feb. 6, 1940 |
| 2,457,016 | Vilkomerson | Dec. 21, 1948 |